United States Patent [19]
Cornett et al.

[11] 4,037,178
[45] July 19, 1977

[54] MEANS FOR ATTACHING A FERRITE TRANSDUCER TO A DISK RESONATOR

[75] Inventors: Lee G. Cornett, Villa Park; Wesley D. Peterson, Santa Ana, both of Calif.

[73] Assignee: Rockwell International Corporation, El Segundo, Calif.

[21] Appl. No.: 673,552

[22] Filed: Apr. 5, 1976

[51] Int. Cl.² ............................................. H03H 9/02
[52] U.S. Cl. ................................. 333/71; 333/30 M
[58] Field of Search ............... 333/30 M, 71; 310/26; 156/294

[56] References Cited
U.S. PATENT DOCUMENTS

| 3,284,727 | 11/1966 | Carlson et al. | 333/71 X |
| 3,937,641 | 2/1976 | Kushner et al. | 156/294 X |

*Primary Examiner*—Paul L. Gensler
*Attorney, Agent, or Firm*—Howard R. Greenberg; Robert J. Crawford

[57] ABSTRACT

In a mechanical filter, a ferrite transducer rod is attached to a disk resonator by bonding with an adhesive which is deposited in an annular housing affixed to the disk prior to inserting the transducer rod therein.

11 Claims, 3 Drawing Figures

4,037,178

MEANS FOR ATTACHING A FERRITE TRANSDUCER TO A DISK RESONATOR

BACKGROUND OF THE INVENTION

The present invention pertains generally to disk-type mechanical filters and specifically to a means for efficaciously attaching the ferrite transducer rod of the filter to a disk resonator.

Disk-type mechanical filters, such as disclosed in U.S. Pat. No. 3,633,133 entitled "Narrow Bandwidth Mechanical Filter Using Large Area Coupling Wires," may employ ferrite transducer rods to magnetostrictively convert between electrical and mechanical energy. The transducer is normally attached to the center of a disk resonator which comprises the filter, by bonding with a special adhesive; curable epoxy beng commonly used (ferrite materials not being suitable for welding). The simple technique of using the proper bonding adhesive to attach the transducer to the disk eliminates what would otherwise be an extremely difficult mechanical attachment problem. Although this bond provides an efficacious attachment to the disk, it has been found that high humidity conditions reduce the bonding strength of the adhesive sufficiently so that under the vibrational stresses to which they are subjected, the ferrite transducers tend to become detached from their disks. Although there are epoxies that exhibit good bonding strengths even at high humidity, their moduli of elasticity vary too erratically with changing temperature conditions to achieve a necessary constant coupling coefficient between the transducer and disk to assure uniform operating filter characteristics over the temperature range to which the filter may be exposed. Thus, these high moisture resistant epoxies are unsuitable for use in attaching the transducers to the disks. Although the problem could be obviated by housing the filters in hermetically sealed cases so as to insulate them from humidity, such a solution is not commercially acceptable because of the associated high cost which would render the filter economically noncompetitive.

With the foregoing in mind, it is a primary object of the present invention to provide a new and improved means for attaching ferrite transducer rods to disk resonators such as used in mechanical filters.

It is a further object of the present invention to provide such a new and improved means of attachment which even under high humidity conditions, is efficacious, yet is inexpensive and avoids mechanical means which are impractically difficult to use.

The foregoing objects, as well as others, and the means by which they are achieved through the present invention, may best be appreciated by referring to the Detailed Description of the Invention which follows hereinafter together with the appended drawing.

BRIEF DESCRIPTION OF THE INVENTION

In accordance with the stated objects, a ferrite transducer rod is attached to a disk resonator through the use of an annular housing which is affixed to the disk and into which the transducer is inserted. A bonding adhesive deposited in the housing prior to insertion of the transducer provides an efficacious bond at the end of the rod where it joins the disk as well as in the confined space between the rod and the inner wall of the housing as the adhesive is squeezed along the wall during the insertion. The annular housing, which is preferably cylindrical with an open-ended flanged base that is affixed to the disk resonator, not only increases the bond area for improving the efficacy of the bond, but also produces a moisture seal which materially inhibits moisture absorption and consequently the diminution of bonding strength of the adhesive located at the end of the transducer where it joins the disk and in the immediate vicinity thereof.

DETAILED DESCRIPTION OF THE INVENTION

Figure 1:
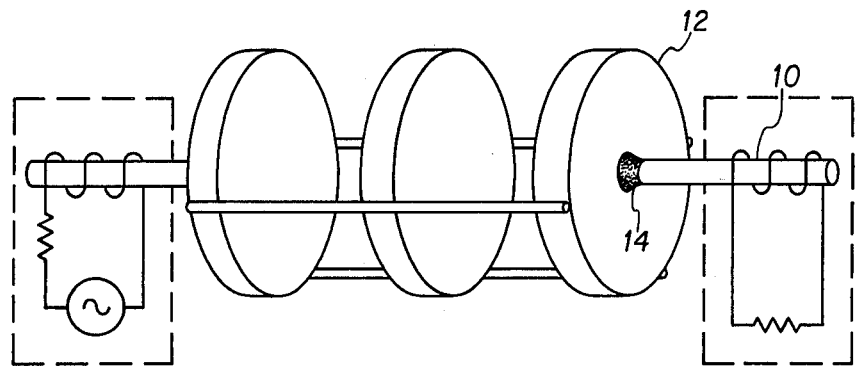
FIG. 1 is an isometric view of typical mechanical filter to which the invention applies.

As shown in FIG. 1, a typical disk-type mechanical filter employs a ferrite rod transducer 10 which is attached to a mechanical disk 12 by bonding with an adhesive 14 drawn from one of the commerically available types, such as curable epoxies, which is located around the end of the transducer 10 where it joins the disk 12. Bearing in mind that the diameter of the rod could be typically in the order of 0.054 inch or as small as 0.033 inch, it may very well be appreciated that the exceedingly small bonding area requires a highly efficacious bond if it is to withstand high vibrational stresses to which it is subjected. It should also be appreciated that any diminution in bonding strength, such as caused by high humidity conditions, can easily cause the transducer 10 to separate from the disk resonator 12.

Figure 2:
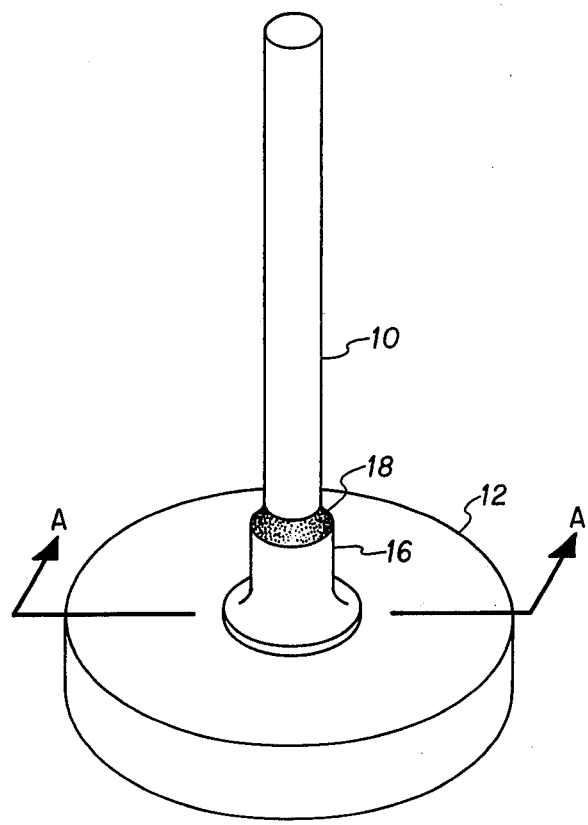
FIG. 2 is an isometric view of the invention.
Figure 3:
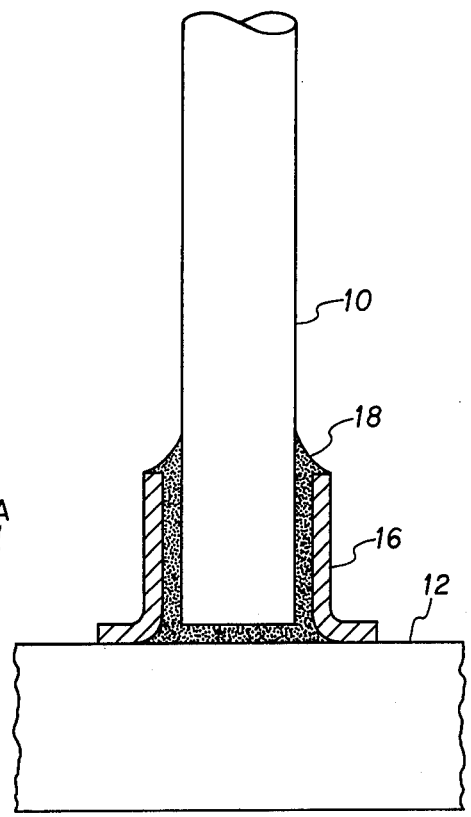
FIG. 3 is a cross-sectional view of FIG. 2 along lines A—A.

As shown in FIGS. 2 and 3, the invention herein contemplates an annular housing 16, such as the eyelet depicted, which is directly affixed to the disk 12 by any desired technique, such as, preferably by welding the flange portions thereof. Before the transducer rod 10 is inserted in housing 16, a conventional adhesive 18 is deposited therein for bonding the transducer 10 to the disk 12 and the inner wall of the housing 16. The inner diameter of the housing 16 should be large enough to accommodate the transducer 10, yet small enough so as to provide minimum clearance once the transducer 10 is inserted therein (with a ferrite transducer rod diameter of 0.054 inch, 0.055 inch for the inner diameter of housing 16 was found to produce desired results). Moreover, the amount of adhesive 18 deposited in the housing 16 prior to insertion of the transducer 10 should be sufficient so that as insertion is effectuated, the adhesive 18 is squeezed along the inner wall of housing 16, preferably extending out onto its rim so as to fully occupy the confined space in the housing 16, to achieve a good consistency of bond and to optimize the use of the adhesive 18 as a moisture seal. It is to be noted that with housing 16 welded to the metal disk 12 (or secured by any other effective means) moisture can penetrate the adhesive 18 only from the narrow annular opening at its top. This, together with the use of the column of adhesive 18 as a formidable barrier to inhibit moisture absorption, assures the integrity of the bonding strength of the adhesive 18 located between the end of the transducer 10 and the disk 12 and in the immediate vicinity thereof.

Although a cylindrical housing having an open-ended flanged base, in eyelet fashion, is preferred, there is no reason why other types of housings such as a cup having a closed base could not be used. In the case of the latter, the transducer 10 would be bonded to the base of the cup rather than directly to the disk 12. This type of housing permits indirect mechanical coupling between the transducer 10 and disk 12, for example when a coupling wire is used to separate the two to meet electrical design requirements, so that the housing cup would not repose on the disk 12 but rather on a coupling wire welded thereto. The advantage of the preferred housing depicted over other types resides in the ability to achieve a nice thin film adhesive between the end of the transducer 10 and the disk 12 since there are no obstructions to its movement as there might very well be by the inner radius of a drawn cup where the inner wall joins its base.

Aside from the previously alluded to greater bonding area and moisture seal benefits of the invention, it is to be noted that the annular housing 16 can easily and inexpensively be located on the disk resonator 12 so as to position the transducer 10 where desired in order not to alter the filter characteristics. Thus, an efficacious bond using presently available commercial adhesives can be achieved without adversely affecting the filter characteristics or increasing its cost so greatly so as to render the filter commercially unattractive. Since the preferred embodiment herein lends itself to modifications by those skilled in the art which might still very well be within the scope and spirit of the invention, the foregoing Detailed Description is intended to be merely exemplary and not circumscriptive of the invention as it is claimed hereinbelow.

What is claimed is:

1. Means for attaching a ferrite transducer rod to a disk resonator, comprising:
    a bonding adhesive, and
    an annular housing affixed to the disk for receiving the rod while said adhesive is deposited in said housing.

2. The means of claim 1 wherein the inner cross-sectional area of said housing is such that the insertion of the rod therein squeezes some of said adhesive along the inner wall of said housing.

3. The means of claim 2 wherein some of said adhesive is squeezed out onto the rim of said annular housing.

4. The means of claim 1 wherein said housing is cylindrical and has a flanged open base which is affixed to the disk.

5. In a mechanical filter, means for attaching a ferrite transducer rod to a disk resonator, comprising:
    a bonding adhesive, and
    an annular housing affixed to the disk for receiving the rod while said adhesive is deposited in said housing.

6. The means of claim 5 wherein the inner cross-sectional area of said housing is such that the insertion of the rod therein squeezes some of said adhesive along the inner wall of said housing.

7. The means of claim 6 wherein some of said adhesive is squeezed out onto the rim of said annular housing.

8. The means of claim 5 wherein said housing is cylindrical and had a flanged open base which is affixed to the disk.

9. An improved mechanical filter, the improvement comprising:
    a disk resonator;
    a ferrite transducer rod;
    a bonding adhesive, and
    an annular housing affixed to said disk for receiving said rod while said adhesive is deposited in said housing.

10. The filter of claim 9 wherein the inner cross-sectional area of said housing is such that the insertion of the rod therein squeezes some of said adhesive along the inner wall of said housing.

11. The filter of claim 9 wherein said housing is cylindrical and has a flanged open base which is affixed to the disk.

* * * * *